US009316230B2

(12) United States Patent
Yeh et al.

(10) Patent No.: US 9,316,230 B2
(45) Date of Patent: Apr. 19, 2016

(54) THIN FAN, ELECTRONIC SYSTEM AND MANUFACTURING METHOD OF THIN FAN

(71) Applicant: DELTA ELECTRONICS, INC., Kuei San, Taoyuan Hsien (TW)

(72) Inventors: Sheng-Wei Yeh, Taoyuan Hsien (TW); Chiu-Kung Chen, Taoyuan Hsien (TW); Cheng-Chieh Liu, Taoyuan Hsien (TW); Shao-Chang Tu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 14/555,276

(22) Filed: Nov. 26, 2014

(65) Prior Publication Data

US 2015/0275906 A1 Oct. 1, 2015

(30) Foreign Application Priority Data

Mar. 31, 2014 (CN) .......................... 2014 1 0129483

(51) Int. Cl.

| | |
|---|---|
| ***F04D 25/06*** | (2006.01) |
| ***F04D 29/32*** | (2006.01) |
| ***F04D 29/54*** | (2006.01) |
| ***F04D 19/00*** | (2006.01) |
| ***H05K 3/10*** | (2006.01) |
| ***H05K 3/18*** | (2006.01) |
| ***H05K 3/34*** | (2006.01) |
| ***F04D 17/16*** | (2006.01) |
| ***F04D 29/28*** | (2006.01) |

(52) U.S. Cl.

CPC ............ *F04D 25/0693* (2013.01); *F04D 17/16* (2013.01); *F04D 19/002* (2013.01); *F04D 29/281* (2013.01); *F04D 29/325* (2013.01); *F04D 29/541* (2013.01); *H05K 3/105* (2013.01); *H05K 3/182* (2013.01); *H05K 3/341* (2013.01); *H05K 2201/0215* (2013.01); *H05K 2201/0999* (2013.01); *Y10T 29/49147* (2015.01)

(58) Field of Classification Search

CPC ... F04D 17/16; F04D 19/002; F04D 25/0693; F04D 29/281; F04D 29/325; F04D 29/541; H05K 2201/0215; H05K 2201/0999; H05K 3/105; H05K 3/182; H05K 3/341; Y10T 29/49147

See application file for complete search history.

(56) References Cited

U.S. PATENT DOCUMENTS

| | | | | |
|---|---|---|---|---|
| 6,394,768 | B1 * | 5/2002 | Fukuda | H02K 5/00 310/71 |
| 6,486,413 | B1 * | 11/2002 | Ogure | H05K 3/102 174/261 |
| 7,044,721 | B2 * | 5/2006 | Horng | F04D 29/626 417/423.14 |
| 7,345,884 | B2 * | 3/2008 | Horng | F04D 29/582 165/104.33 |
| 7,567,001 | B2 * | 7/2009 | Kasai | F04D 29/624 310/58 |
| 2005/0204544 | A1 * | 9/2005 | Aisenbrey | G06K 19/07749 29/596 |
| 2007/0007834 | A1 * | 1/2007 | Teshima | H02K 15/0056 310/71 |
| 2007/0065639 | A1 * | 3/2007 | Iida | H05K 3/1266 428/141 |

* cited by examiner

*Primary Examiner* — Peter J Bertheaud
*Assistant Examiner* — Dominick L Plakkoottam
(74) *Attorney, Agent, or Firm* — Muncy, Geissler, Olds & Lowe, P.C.

(57) ABSTRACT

A manufacturing method of the thin fan includes the steps of: providing a plastic material containing a plurality of metal particles; processing the plastic material to form a housing; removing a part surface of the housing and forming a layout area and an extended circuit on the housing, wherein one terminal of the extended circuit connects to the layout area; disposing a first signal connecting structure on the housing, wherein the first signal connecting structure connects to the other terminal of the extended circuit; and disposing a metal layer on the layout area and the extended circuit.

10 Claims, 12 Drawing Sheets

2 23 22 21 213 212 219 A2 214 A1 211 215 218

THIN FAN, ELECTRONIC SYSTEM AND MANUFACTURING METHOD OF THIN FAN

CROSS REFERENCE TO RELATED APPLICATIONS

This Non-provisional application claims priority under 35 U.S.C. §119(a) on Patent Application No(s). 201410129483.5 filed in People's Republic of China on Mar. 31, 2014, the entire contents of which are hereby incorporated by reference.

BACKGROUND OF THE INVENTION

1. Field of Invention

The present invention relates to a fan and a manufacturing method thereof, and in particular, to a thin fan and a manufacturing method thereof 2. Related Art As the rapid progressive of electronic industry, the electronic devices (e.g. chips) installed inside the electronic product generate more heat. In order to dissipate the generated heat, it is commonly configuring a fan around the electronic device. The fan can generate an airflow for cooling the electronic device away so as to dissipate the heat generated by the electronic device.

FIG. 1A is a schematic diagram of a conventional fan, and FIG. 1B is a sectional view of the fan of FIG. 1A. To make the description more clear, FIGS. 1A and 1B do not show the upper cover of the housing. With reference to FIGS. 1A and 1B, the fan 1 includes an impeller 11, a stator 12, a circuit board 13, a housing 14, a bearing 15 and a rotor 16. The bearing 15 connects the impeller 11 to the housing 14, and the housing 14 covers the impeller 11. The stator 12 and the circuit board 13 are disposed in the housing 14, and the stator 12 is located corresponding to the rotor 16. The control circuit of the circuit board 13 can control to increase the voltage and current of the motor, so that the motor will generate excitation. Afterwards, the chip controls the polarity inversion of the motor excitation, so the magnet and the motor will generate attraction and repulsion thereby carrying the rotor 16 and the impeller 11 to rotate.

In the manufacturing process of a conventional fan, the electronic components are disposed on the layout of the circuit board by SMD technology, and then assembled with the stator and bearing. This assembled structure as well as the rotor and impeller is installed on the fan housing so as to finish the assembling procedure of the fan.

However, since the minimization is the major trend of the computer products, the cooperating heat-dissipation fan structure must be designed with smaller size. Besides, the electronic components are disposed on one surface of the circuit board, so it is necessary to remain a certain height and space in the fan for configuring the circuit board and the electronic components. This requirement will conflict to the desired design of minimization. In addition, since the shape and size of the circuit board is restricted by the airflow channel and mechanism, the thin design of the fan will be further limited. Moreover, the conventional circuit board must connect to an additional wire, which is disposed inside the housing and connects to the circuit, for controlling the magnet conversion of the motor excitation. However, the configuration of the wire must consider the safety issue. In more specific, when the fan is operating, the rotating blades may hit the wire and thus cause the undesired damage.

Therefore, it is an important subject to provide a thin fan, an electronic system and a manufacturing method of a thin fan, which can decrease the entire height of the thin fan, effectively utilize the inside space and achieve the same heat-dissipation effect as the conventional art without configuring the additional wire in the housing for providing a safety usage.

SUMMARY OF THE INVENTION

In view of the foregoing subject, an objective of the invention is to provide a thin fan, an electronic system and a manufacturing method of a thin fan, which can decrease the entire height of the thin fan, effectively utilize the inside space and achieve the same heat-dissipation effect as the conventional art without configuring the additional wire in the housing for providing a safety usage.

To achieve the above objective, the present invention discloses a manufacturing method of a thin fan, which includes the following steps of: providing a plastic material containing a plurality of metal particles; processing the plastic material to form a housing; removing a part surface of the housing and forming a layout area and an extended circuit on the housing, wherein one terminal of the extended circuit connects to the layout area; disposing a first signal connecting structure on the housing, wherein the first signal connecting structure connects to the other terminal of the extended circuit; and disposing a metal layer on the layout area and the extended circuit.

In one embodiment, the housing further has a protrusion portion, and the first signal connecting structure is disposed on the protrusion portion.

In one embodiment, the manufacturing method further includes a step of disposing a cable on the first signal connecting structure.

In one embodiment, the housing further has a recess, the first signal connecting structure is formed at the periphery of the recess, and the cable is connected to the first signal connecting structure.

In one embodiment, the housing further has a fixing unit, and the first signal connecting structure is disposed on the fixing unit.

In one embodiment, the housing includes a first surface and a second surface opposite to the first surface, the layout area is disposed on the first surface, the first signal connecting structure is disposed on the second surface, and the extended circuit is extended from the first surface to the second surface.

In one embodiment, the step of removing the part surface of the housing is used to roughen the surface and to expose a part of the metal particles.

In one embodiment, the step of removing the part surface of the housing is performed by laser ablation.

In one embodiment, the step of deposing the metal layer on the layout area and the extended circuit is performed by using chemical plating to form the metal layer.

In one embodiment, the manufacturing method further includes the steps of: disposing at least an electronic component on the metal layer; and assembling the housing with a stator and an impeller.

To achieve the above objective, the present invention also discloses a thin fan including a housing, a stator and an impeller. The housing is composed of a plastic material containing a plurality of metal particles and includes a layout area, an extended circuit, a first signal connecting structure and a metal layer. A part of the metal particles is exposed to the layout area, and a part of the metal particles is exposed to the extended circuit. One terminal of the extended circuit connects to the layout area, and one terminal of the first signal connecting structure connects to the other terminal of the extended circuit. The metal layer is disposed on the layout area and the extended circuit, and binds with the exposed metal particles. The stator is disposed in the housing, and the impeller is covered by the housing.

To achieve the above objective, the present also discloses an electronic system including a thin fan and an electronic device. The thin fan includes a housing, a stator and an impeller. The housing is composed of a plastic material containing a plurality of metal particles, and includes a layout area, an extended circuit, a first signal connecting structure and a metal layer. A part of the metal particles is exposed to the layout area, and a part of the metal particles is exposed to the extended circuit. One terminal of the extended circuit connects to the layout area, and one terminal of the first signal connecting structure connects to the other terminal of the extended circuit. The metal layer is disposed on the layout area and the extended circuit, and binds with the exposed metal particles. The stator is disposed in the housing, and the impeller is covered by the housing. The electronic device has a second signal connecting structure connecting with the first signal connecting structure.

In one embodiment, the housing further has a protrusion portion, and the first signal connecting structure is disposed on the protrusion portion.

In one embodiment, the housing includes a cable, and the cable is connected to one terminal of the first signal connecting structure.

In one embodiment, the housing includes a cable, the cable is connected to one terminal of the first signal connecting structure, and the other terminal of the cable is connected to the second signal connecting structure.

In one embodiment, the housing further includes a fixing unit, and the first signal connecting structure is disposed on the fixing unit.

In one embodiment, the housing includes a first surface and a second surface opposite to the first surface. The layout area is disposed on the first surface, the first signal connecting structure is disposed on the second surface, and the extended circuit is extended from the first surface to the second surface.

As mentioned above, the manufacturing method of a thin fan of the invention is to process a plastic material containing a plurality of metal particles to form a housing, to remove a part surface of the housing and form a layout area and an extended circuit on the housing, and to dispose a metal layer on the layout area and the extended circuit, wherein one terminal of the extended circuit connects to the layout area, and the other terminal thereof connects to the first signal connecting structure disposed on the housing. The step of removing the part surface of the housing is used to expose the metal particles, and the metal layer is disposed on the layout area and the extended circuit so as to contact with the exposed metal particles, thereby electrically connecting the layout area to the first signal connecting structure through the extended circuit. Compared with the conventional art, the thin fan of the invention removes the space for configuring the control circuit board in the conventional design. This configuration can decrease the entire height of the thin fan and effectively utilize the inside space. In addition, the extended circuit is extended to the periphery, outside or inside of the housing and connected to the first signal connecting structure. The configuration of the extended circuit can prevent the safety issue (e.g. the wire is hit by the blades), and save the space for configuring the connection with other electronic devices. Moreover, this invention can further provide the variability on the design of the extended circuit and the first signal connecting structure so as to benefit the design of the thin fan.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
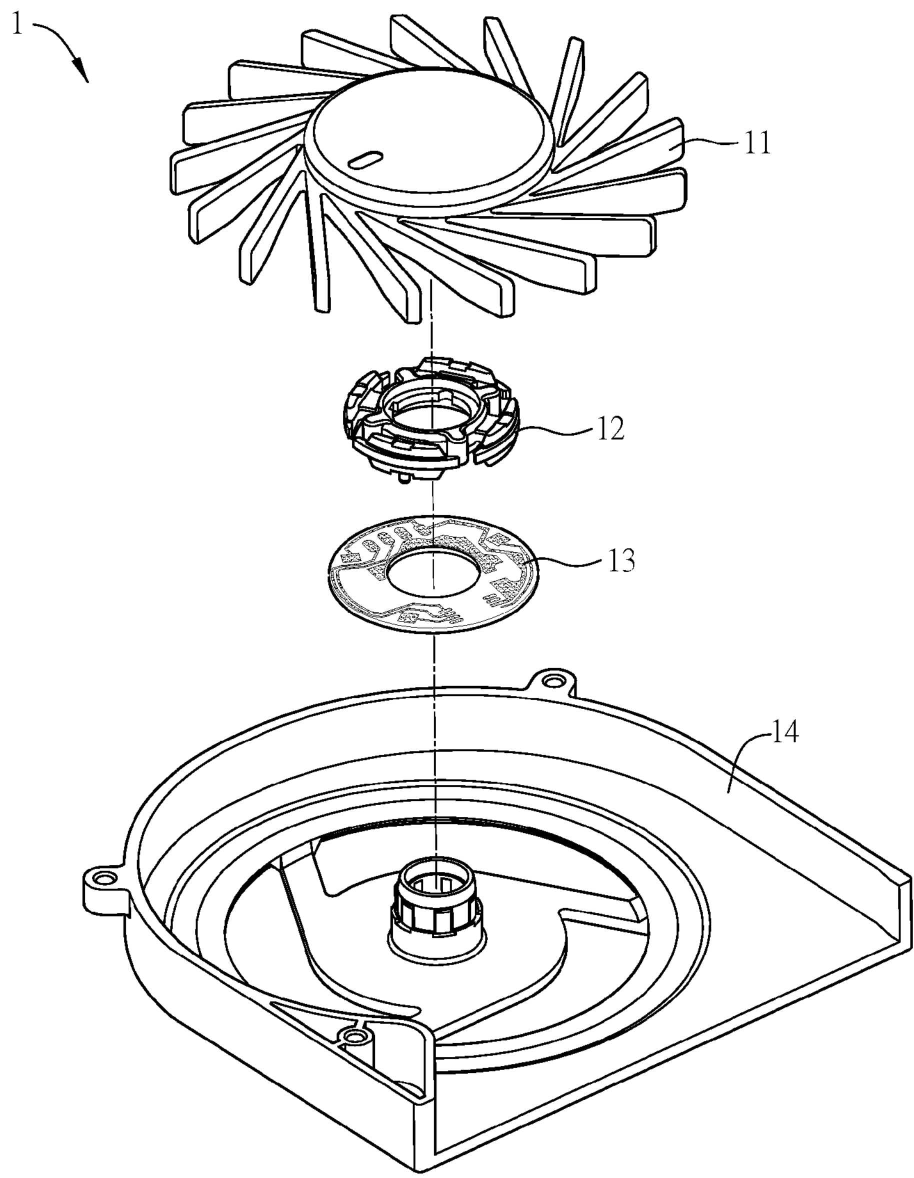
FIG. 1A is a schematic diagram showing a conventional fan.
Figure 1B:
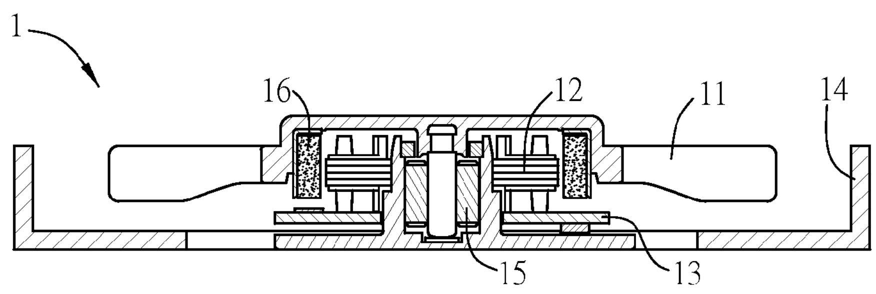
FIG. 1B is a sectional view of the fan of FIG. 1A.
Figure 2A:
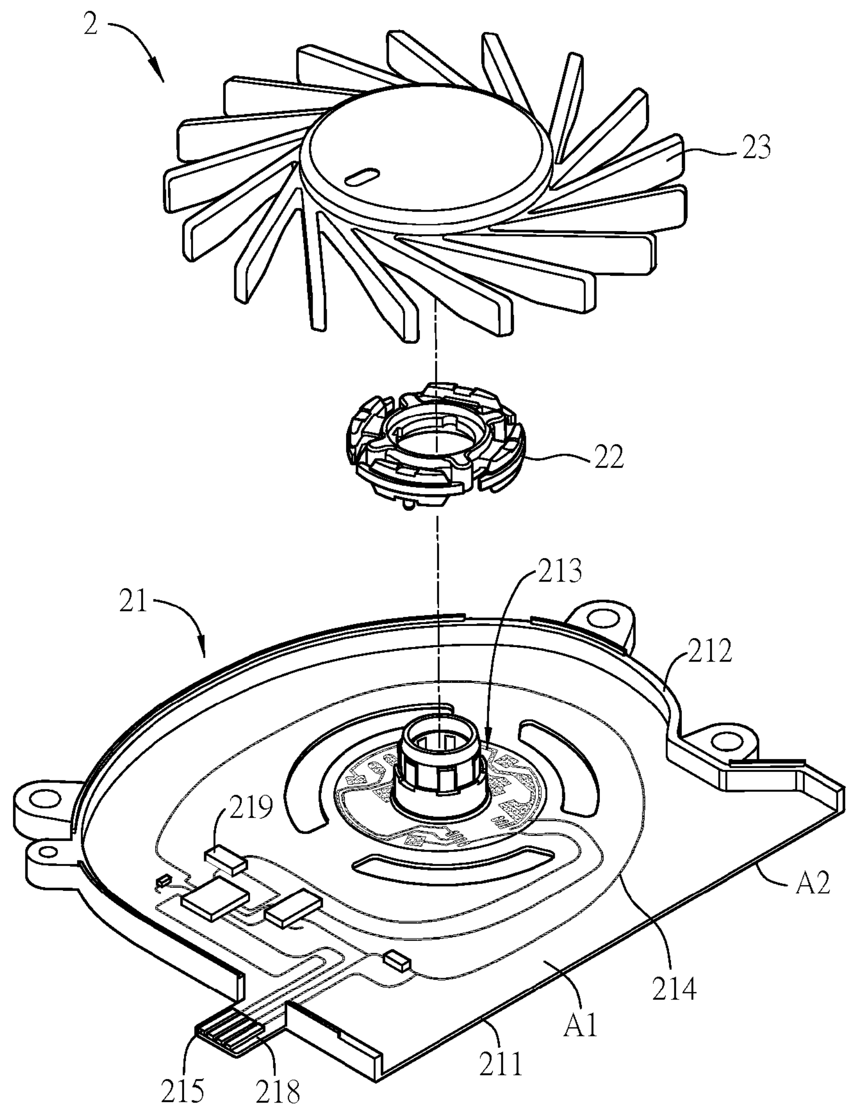
FIG. 2A is an exploded view of a thin fan according to a preferred embodiment of the invention.
Figure 2B:
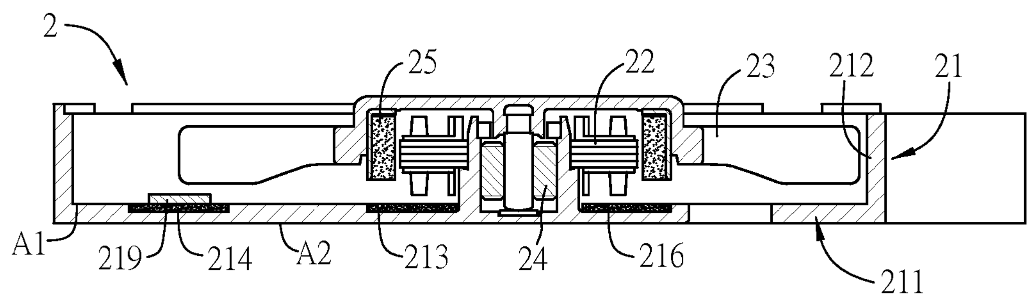
FIG. 2B is a sectional view of the assembled thin fan of FIG. 2A.

FIG. 2A is an exploded view of a thin fan 2 according to a preferred embodiment of the invention, and FIG. 2B is a sectional view of the assembled thin fan 2 of FIG. 2A. Referring to FIGS. 2A and 2B, the thin fan 2 includes a housing 21, a stator 22 and an impeller 23. The housing 21 includes a base 211 and a side wall 212, which is at least partially disposed on the periphery of the base 211. This embodiment discusses a centrifugal thin fan 2 for example, so the side wall 212 only partially disposed on the periphery of the base 211. In other words, the part of the periphery of the base 212, which is not configured with the side wall 212, is used as the inlet of the fan. Of course, in other embodiments, the side wall can be disposed around the entire periphery of the base, and this invention is not limited thereto. In addition, the surface of the housing 21 includes a first surface A1 and a second surface A2 disposed opposite to the first surface A1. In more detailed, the inside portion of the housing 21 defined by the base 211 and the side wall 212 is the first surface A1, and the outside of the housing 21 is the second surface A2.

In this embodiment, the housing 21 includes a layout area 213, an extended circuit 214, a first signal connecting structure 215 and a metal layer 216. In more detailed, the layout area 213 and the extended circuit 214 are the wires formed on the housing 21. The layout area 213 corresponds to the conventional circuit board, and the extended circuit 214 is extended from the layout area 213. In this embodiment, the housing 21 is made of a plastic material containing a plurality of metal particles 217 (see FIG. 5), and a part of the metal particles 217 is exposed in the layout area 213 and the extended circuit 214. One terminal 2141 of the extended circuit 214 is connected to the layout area 213. The metal layer 216 is disposed on the layout area 213 and binds with the exposed metal particles 217, thereby providing the extended circuit 214 and the first signal connecting structure 215 with the power and/or signal transmission function. The extended circuit 214 extends to the periphery and outside (the second surface A2) of the housing 21. The first signal connecting structure 215 is disposed on the housing 21 and, preferably, on the periphery and outside (the second surface A2) of the housing 21. The formation and detailed configuration/connection thereof will be described hereinafter.

Figure 3:
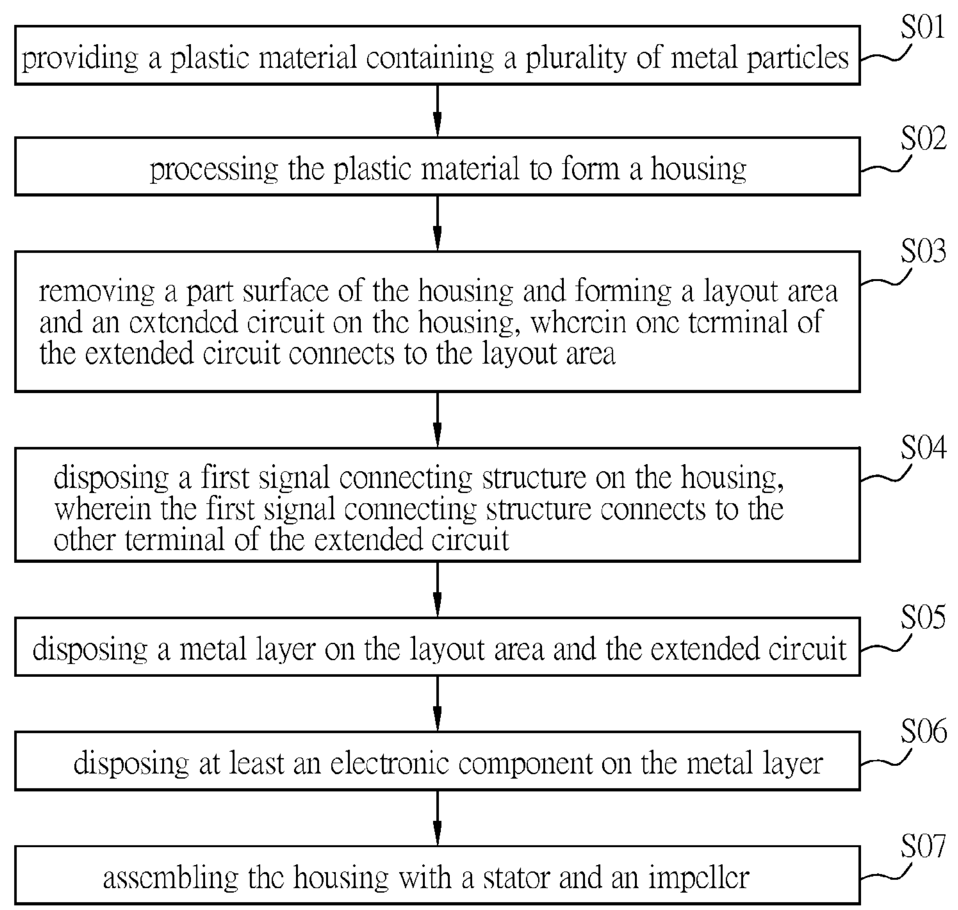
FIG. 3 is a flow chart showing a manufacturing method of a thin fan according to a preferred embodiment of the invention.

The housing 21, the layout area 213 and the metal layer 216 can be manufactured by the manufacturing method shown in FIG. 3. FIG. 3 is a flow chart showing a manufacturing method of a thin fan according to a preferred embodiment of the invention. The manufacturing method of the components of the thin fan 2 as well as the connections thereof will be described hereinafter with reference to FIG. 3. The manufacturing method of the thin fan 2 according to the embodiment of the invention mainly includes the steps of: providing a plastic material containing a plurality of metal particles (step S01); processing the plastic material to form a housing (step S02); removing a part surface of the housing and forming a layout area and an extended circuit on the housing, wherein one terminal of the extended circuit connects to the layout area (step S03); disposing a first signal connecting structure on the housing, wherein the first signal connecting structure connects to the other terminal of the extended circuit (step S04); and disposing a metal layer on the layout area and the extended circuit (step S05). In the step SOL a plastic material containing a plurality of metal particles 217 is provided (see FIG. 5). Herein, the plastic material containing a plurality of metal particles 217 can be a PPA plastic material, LCP plastic material, or other plastic materials containing metal particles 217. Besides, the metal particles 217 can be made of copper and/or chromium metal particles, and the above-mentioned materials for the plastic material and metal particles 217 are not to limit the invention.

Figure 4:
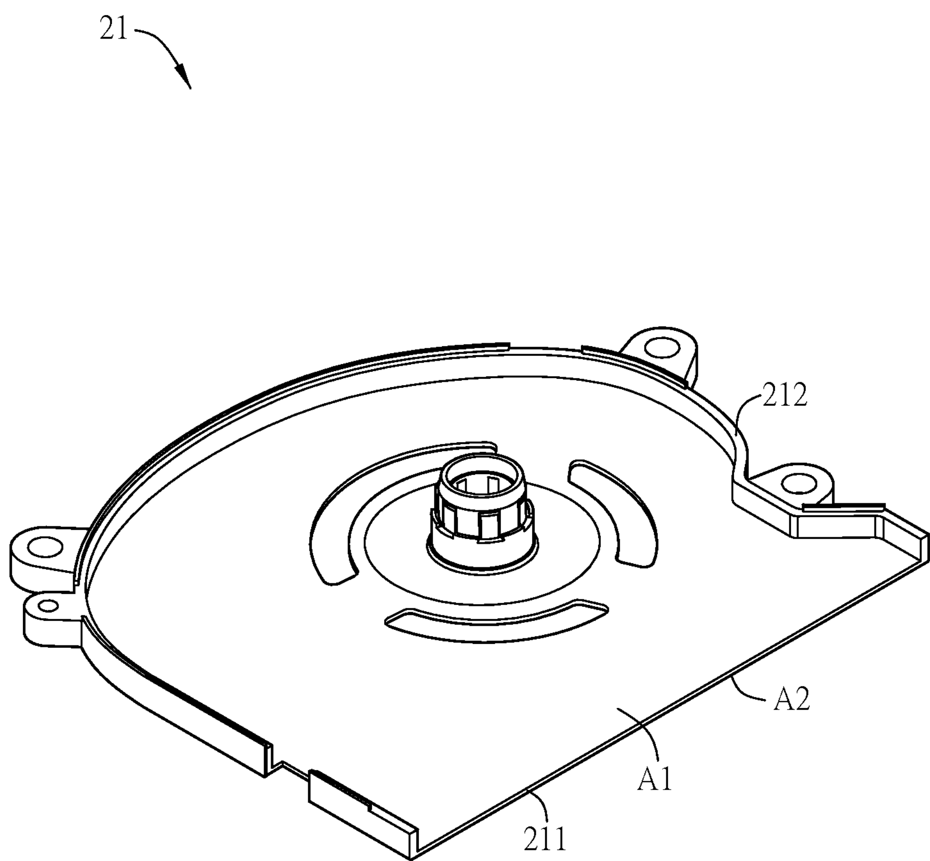
FIG. 4 is a schematic diagram showing the step S02 of FIG. 3.

In the step S02, the plastic material containing the metal particles 217 is processed to form a housing 21. FIG. 4 is a schematic diagram showing the step S02 of FIG. 3 for forming the housing 21. In more detailed, a mold (not shown) is provide and then the plastic material is disposed into the mold. The size and aspect of the mold are substantially corresponding to the size and aspect of the housing to be formed. As mentioned above, this embodiment takes a centrifugal thin fan 2 as an example, so that the housing 21 includes a base 211 and a side wall 212 disposed on a part of the periphery of the base 211. Of course, in other embodiments, the mold with different sizes and aspects can also be used depending on the actual requirement. In addition, the mold can be made of any known proper material, so the detailed description thereof will be omitted. Moreover, the housing 21 can be made of the plastic material by using injection molding or casting molding. In general, the solid plastic material is heated and melted, and then the melted plastic material flows into the mold. Afterwards, the plastic material is solidified. In this embodiment, the melted plastic material can be solidified by cooling and coagulating so as to form the housing 21 with the base 211 and the side wall 212.

Figure 5:
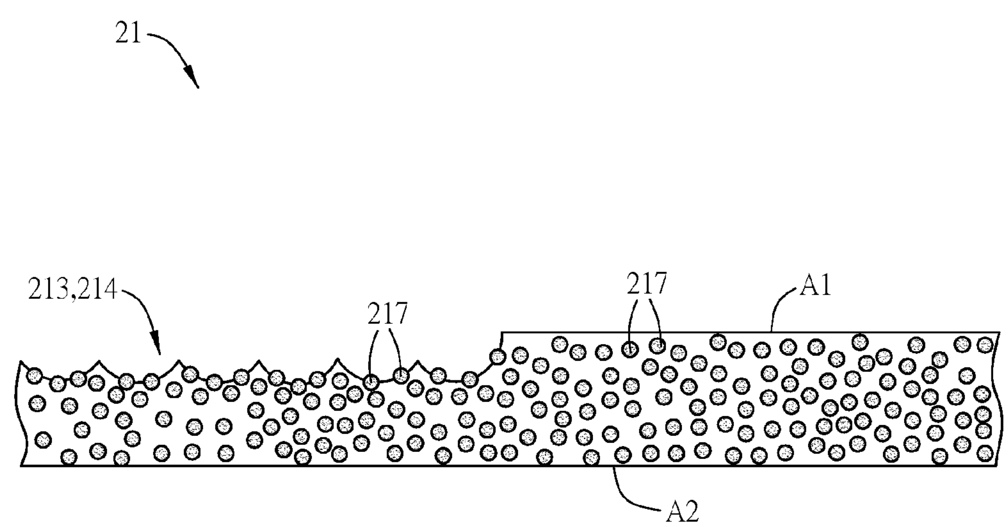
FIG. 5 is a schematic diagram showing the layout area formed in the step S03 of FIG. 3.

FIG. 5 is a schematic diagram showing the layout area formed in the step S03 of FIG. 3. In other words, FIG. 5 shows a part of the housing 21. With reference to FIGS. 2 to 5, the step S03 removes a part surface of the housing 21 (see FIG. 4) so as to form a layout area 213 and an extended circuit 214 on the housing 21 (see FIG. 2A). The processed “surface” mainly includes the first surface A1 and, of course, the second surface A2. In other words, which part of the first surface A1 of the housing should be removed is determined according to the requirement as well as the ranges of the layout area 213 and the extended circuit 214. Referring to FIGS. 2A and 5, the part of exposed metal particles 217 is the layout area 213 or the extended circuit 214. To be noted, this part is referred to 213 and 214 in FIG. 5, which means that this part can be either the layout area 213 or the extended circuit 214. In more detailed, the surface of the housing 21 can be partially removed by laser ablation so as to roughen the surface (the first surface A1 and/or the second surface A2), thereby exposing a part of the metal particles from the housing 21. In this embodiment, the center area of the housing 21 is defined as the layout area 213, which is the position of the conventional circuit board, and the residual part extending from the layout area 213 is defined as the extended circuit 214. The extended circuit 214 extends to the periphery of the housing 21 and further to the outside surface of the housing 21 (the second surface A2).

In this embodiment, the housing 21 is made of a plastic material containing a plurality of metal particles 217, but this invention is not limited thereto. In other embodiments, the housing can be made of a plastic material containing a plurality of metal particles and a plastic material without any metal particle. For example, the plastic material containing a plurality of metal particles is processed by injection molding to form a first member, and the plastic material without any metal particle is then processed by injection molding to form a second member, which is used to bind with the first member. Accordingly, the housing can be formed with a part containing the metal particles and a part without any metal particle. In this case, the part containing the metal particles can function as the layout area.

Referring to FIG. 2, the housing 21 includes a layout area 213, an extended circuit 214 and a first signal connecting structure 215. Herein, the part containing the exposed metal particles 217 includes the layout area 213 and the extended circuit 214. In the step S04 of FIG. 3, the first signal connecting structure 215 is disposed on the housing 21, and is connected to one terminal 2142 of the extended circuit 214. In other words, one terminal 2141 of the extended circuit 214 is connected to the layout area 213, and the other terminal 2142 thereof is connected to one terminal 2151 of the first signal connecting structure 215.

As shown in FIG. 5, since the metal particles 217 are distributed individually, the electrical connection between the layout area 213, the extended circuit 214 and the first signal connecting structure 215 is not established initially. Then, referring to FIGS. 2 and 3, the step S05 disposes a metal layer 216 on the layout area 213 and the extended circuit 214. In this embodiment, the metal layer 216 is disposed on the layout area 213 and the extended circuit 214 by chemical plating, so that the metal layer 216 can be bound with the metal particles 217 exposed from the layout area 213 and the extended circuit 214. Accordingly, one terminal 2142 of the extended circuit 214 is connected to one terminal 2151 of the first signal connecting structure 215, thereby electrically connecting the layout area 213, the extended circuit 214 and the first signal connecting structure 215.

The extended circuit 214 is the control circuit of the thin fan 2, and the first signal connecting structure 215 is the component for communicating the thin fan 2 and other electronic devices. In this embodiment, other electronic devices can input power source/signals into the extended circuit 214 through the first signal connecting structure 215 for controlling the operation of the thin fan 2. Of course, in other embodiments, if necessary, the thin fan 2 can output the power source/signals through the first signal connecting structure 215, and this invention is not limited.

Figure 6:
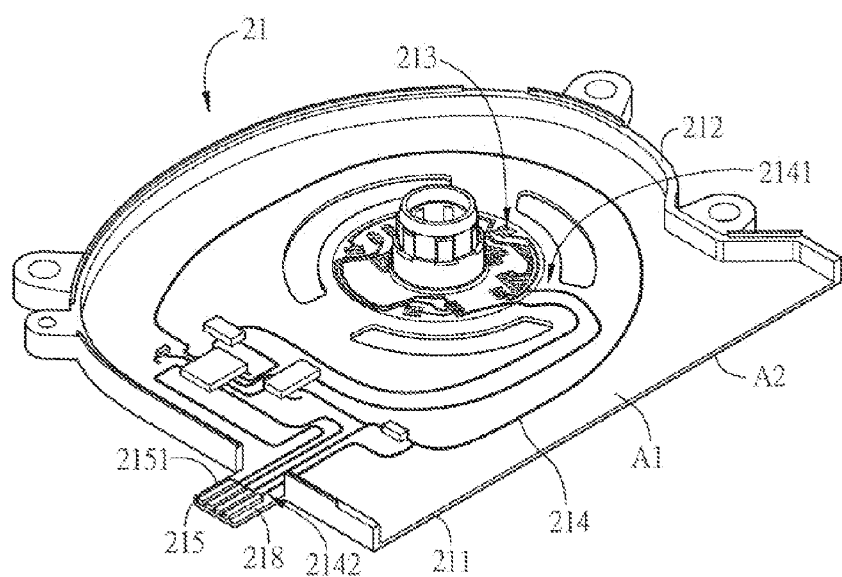
FIG. 6 is an enlarged view of the housing of FIG. 2.

FIG. 6 is an enlarged view of the housing 21 of FIG. 2. Referring to FIG. 6, the housing 21 can further include a protrusion portion 218, and the first signal connecting structure 215 is disposed on the protrusion portion 218. The protrusion portion 218 is extended from the base 211 to the outside of the side wall 212. Preferably, the protrusion portion 218 and the base 211 are continuous and no side wall 212 is disposed therebetween. In this embodiment, the first signal connecting structure 215 can be a signal connection with the golden finger function. When the thin fan is applied to another electronic system or device, the electronic system or device has a corresponding terminal port (a second signal connecting structure) for connecting with the first signal connecting structure 215. Of course, the first signal connecting structure 215 can have different aspects, which will be further discussed after the description of the manufacturing method of the thin fan 2.

Referring to FIGS. 2A, 2B and 3, the manufacturing method of the thin fan 2 preferably further includes the steps of: disposing at least an electronic component 219 on the metal layer 216 (step S06); and assembling the housing 21 with a stator 22 and an impeller 23 (step S07). In the step S06, the electronic components 219 are disposed on the metal layer 216. In this embodiment, the electronic components 219 are disposed on the metal layer 216 by welding, so that the metal layer 216 can couple or electrical connect the electronic components 219. In the step S07, the housing 21 is assembled with a stator 22 and an impeller 23. To be noted, the upper cover portion of the housing 21 is omitted in FIGS. 2A and 2B for easily viewing and description. The housing 21, which is formed with the layout area 213 and the metal layer 216, is assembled with a stator 22 and an impeller 23 so as to form a thin fan 2. The stator 22 is disposed in the housing 21, and the impeller 23 is connected to the housing 21 through a bearing 24. In addition, a rotor 25, which is configured opposite to the stator 22, is disposed on the impeller 23. The thin fan 2 of this embodiment is, for example but not limited to, a centrifugal fan. The structure of the thin fan 2 of the invention can also be applied to other axial-flow fans, mixed-flow fans, or cross-flow fans, and this invention is not limited.

To be noted, the extended circuit and the metal layer can be disposed on a part of the housing rather than the center area of the housing. If the circuit variation or design is needed, the extended circuit can extend towards the periphery and two surfaces (the first and second surfaces) of the housing, and the first signal connecting structure can also be disposed on the first surface or the second surface of the housing. In addition, the first signal connecting structure can further connect to other devices such as the cable, so that it can be easily applied to other electronic systems.

Figure 7A:
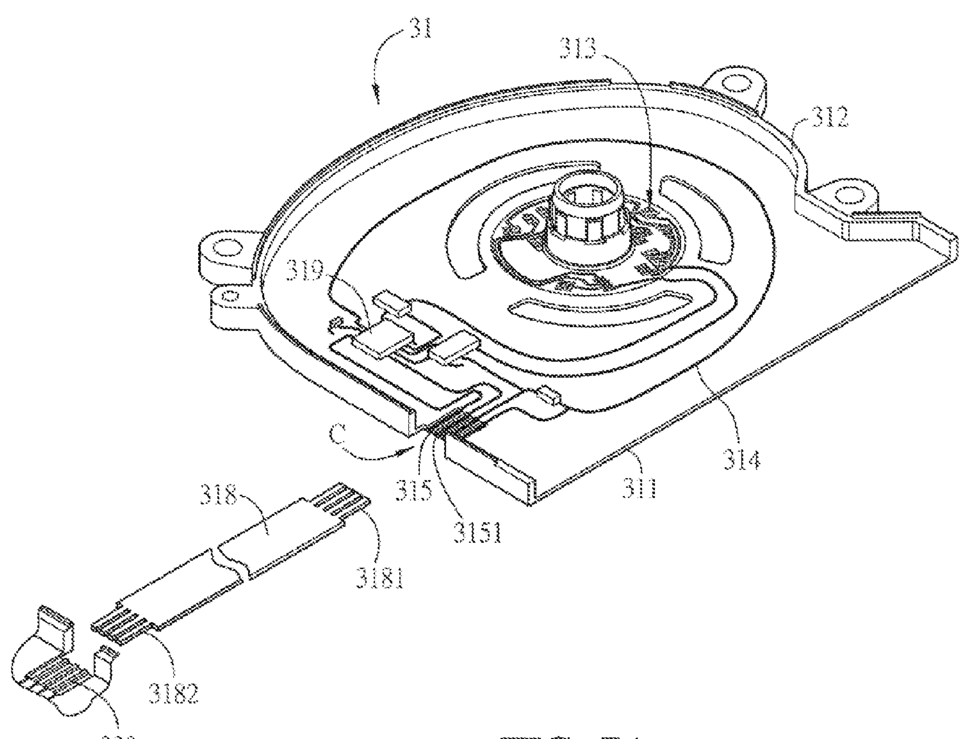
FIG. 7A is a schematic diagram showing another aspect of the housing.
Figure 7B:
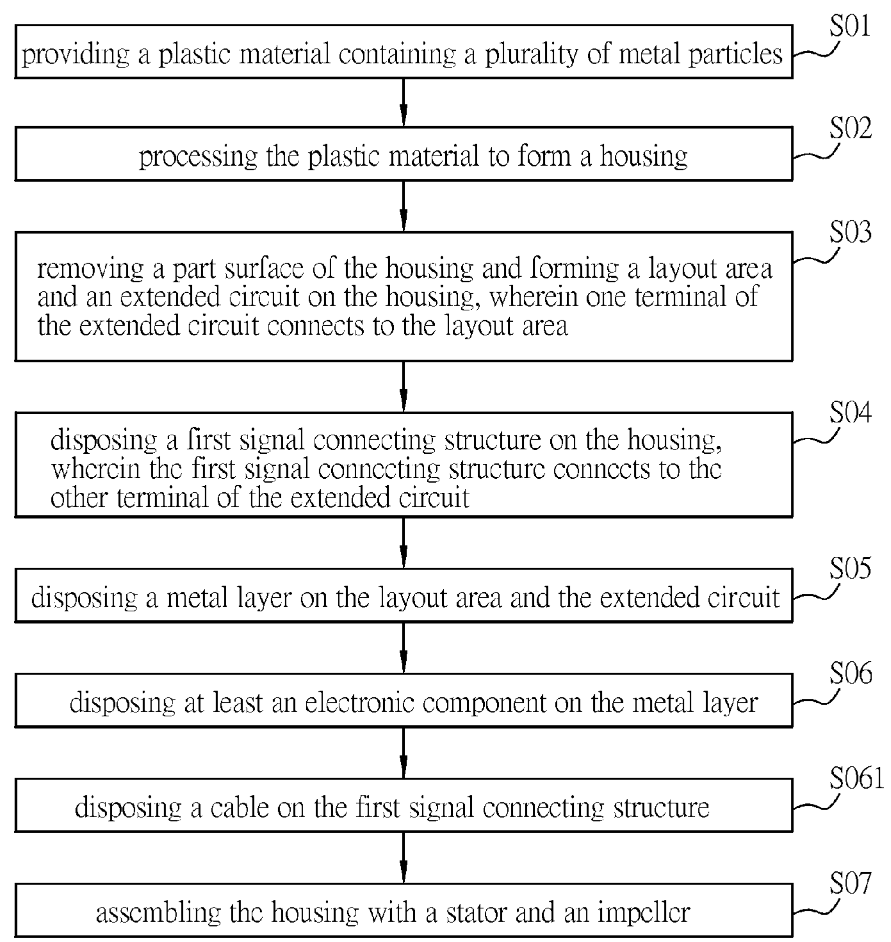
FIG. 7B is a flow chart showing a manufacturing method of a thin fan according to another preferred embodiment of the invention.

FIG. 7A is a schematic diagram showing another aspect of the housing of FIG. 2A, and FIG. 7B is a flow chart showing a manufacturing method of a thin fan according to another preferred embodiment of the invention. A housing 31 of this embodiment is provided to substitute the housing 21 of FIG. 2A so as to form the thin fan of a second embodiment. Referring to FIGS. 7A and 7B, in this embodiment, the housing 31 includes a cable 318 having one terminal 3181 connecting to one terminal 3151 of the first signal connecting structure 315. Accordingly, the manufacturing method of a thin fan of this embodiment further includes a step S061 for disposing a cable 318 on the first signal connecting structure 315. In more detailed, the cable 318 is provided corresponding to the first signal connecting structure 315 and then welded to the edge of the base 311 of the housing 31. Preferably, the edge of the housing 31 further has a recess C. In other words, the base 311 of the housing 31 is formed with a recess C, and the first signal connecting structure 315 is disposed at the edge of the recess C. When the cable 318 is connected to the first signal connecting structure 315, the cable 318 will not affect the entire structure of the thin fan 2. This step S061 can be performed at any timing after the step S05. For example, the step S061 can be performed before, after or at the same time as the step S06 of disposing the electronic components 319 on the metal layer 316, and this invention is not limited.

In this embodiment, when the thin fan (including the housing 31) of the second embodiment is applied to an electronic system, the electronic devices of the electronic system can have a second signal connecting structure for connecting with the cable. In other words, one terminal 3181 of the cable 318 is connected to the first signal connecting structure, and the other terminal 3182 thereof is connected to the second signal connecting structure 320 of other electronic devices.

Figure 8:
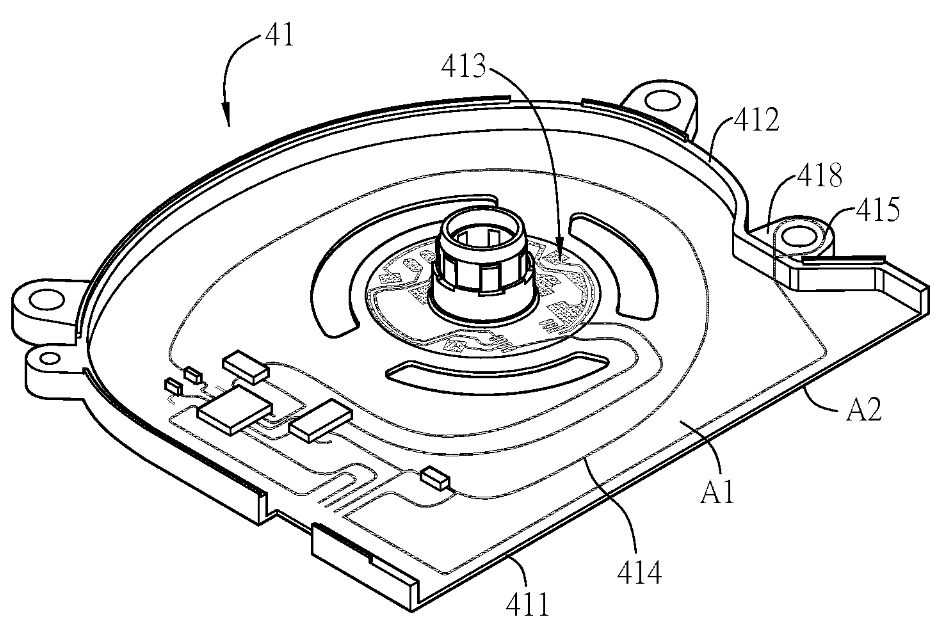
FIG. 8 is a schematic diagram showing another aspect of the housing.

FIG. 8 is a schematic diagram showing another aspect of the housing of FIG. 2A. Similarly, a housing 41 of this embodiment is provided to substitute the housing 21 of FIG. 2A so as to form the thin fan of a third embodiment. Referring to FIG. 8, in this embodiment, the outside of the side wall 412 of the housing 41 is partially extended outwardly so as to form a fixing unit 418, and the first signal connecting structure 415 is disposed on the fixing unit 418. The surface of the fixing unit 418 is partially removed to expose the metal particles, and a metal layer is formed thereon so as to form the first signal connecting structure 415. In more detailed, the extended circuit 414 of this embodiment extends to the side wall 412 and connects to the first signal connecting structure 415. In practice, after the first surface A1 of the housing 41 is partially removed by laser ablation (referring to the step S03 of FIG. 3), the housing 41 is turned over or the laser beam is moved so as to partially remove the first surface A1 of the side wall 412, thereby forming the extended circuit 414 extending to the side wall 412 and the first signal connecting structure 415 extending to the fixing unit 418. In other embodiments, when the thin fan (including the housing 41) of the third embodiment is applied to an electronic system, the electronic devices of the electronic system can have a corresponding second signal connecting structure for connecting to the first signal connecting structure. For example, the position of the second signal connecting structure is corresponding to the first signal connecting structure. When the thin fan is fixed to the electronic device, the first signal connecting structure is connected with the second signal connecting structure. This configuration can further save the needed space so as to achieve the desire of minimization of the thin fan.

Figure 9A:
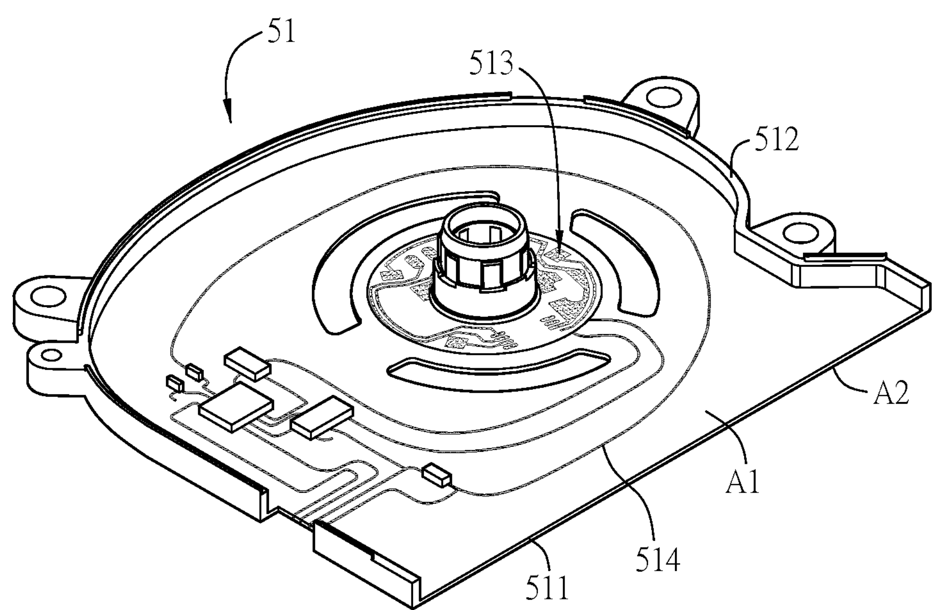
FIG. 9A is a schematic diagram showing another aspect of the housing.
Figure 9B:
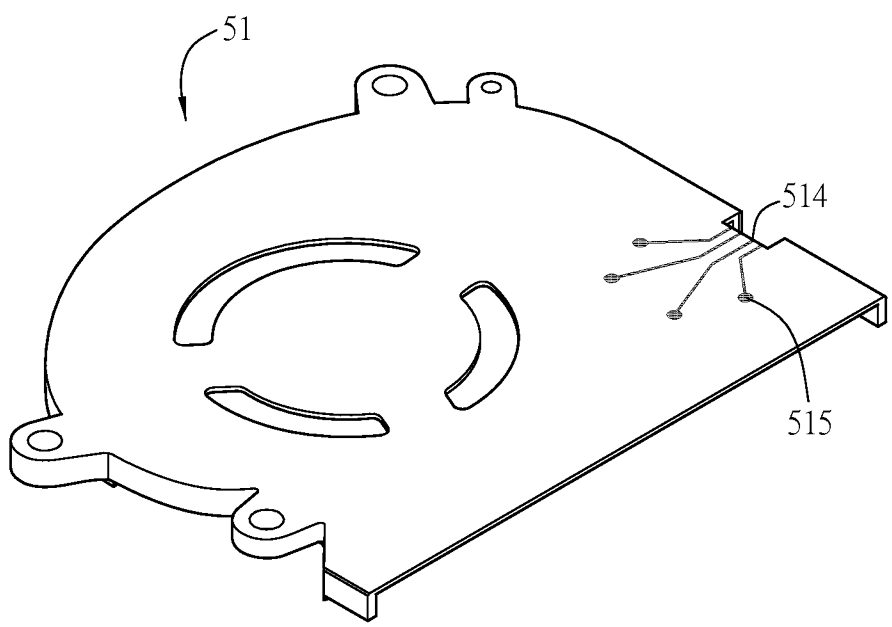
FIG. 9B is a schematic diagram showing the second surface of the housing of FIG. 9A.
Figure 10:
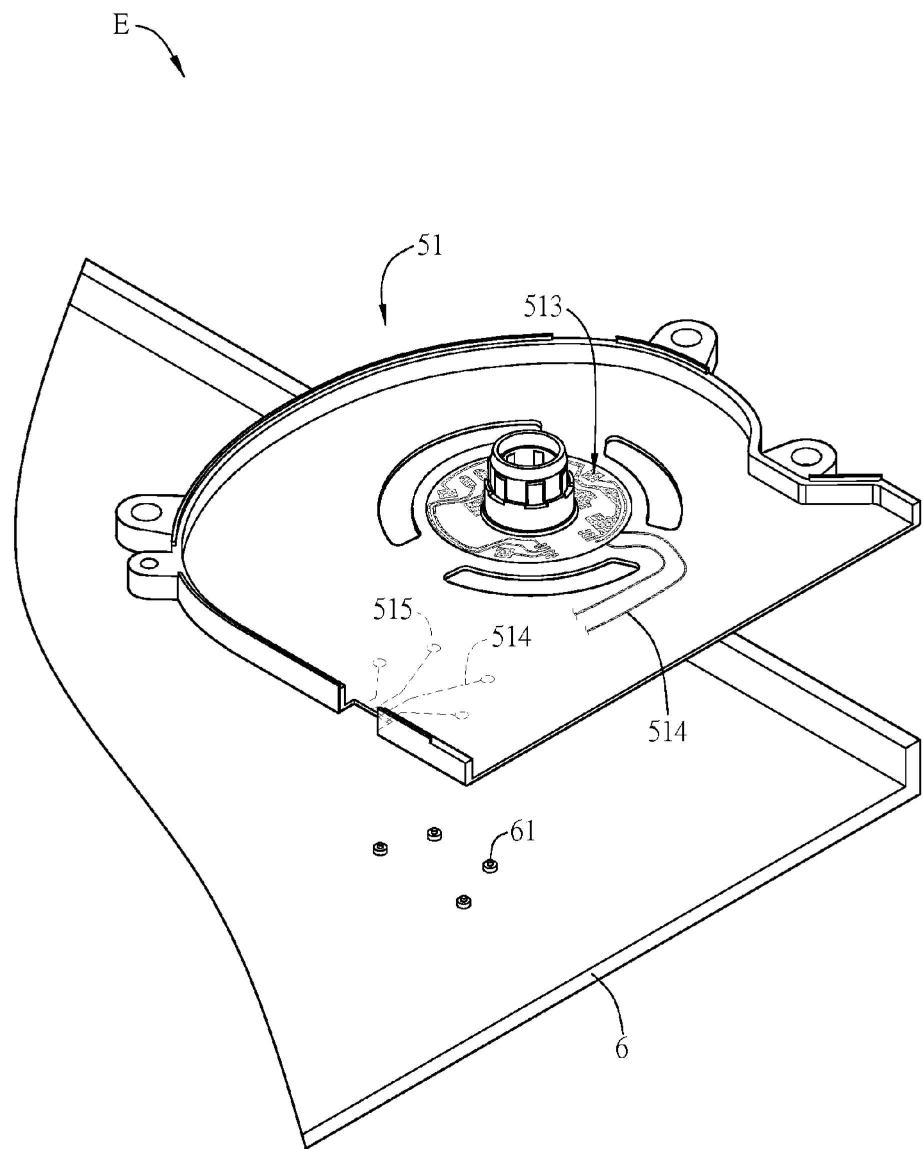
FIG. 10 is a schematic diagram showing the housing of FIG. 9A applied to an electronic system.

FIG. 9A is a schematic diagram showing another aspect of the housing of FIG. 2A, and FIG. 9B is a schematic diagram showing the second surface of the housing of FIG. 9A. A housing 51 of this embodiment is provided to substitute the housing 21 of FIG. 2A so as to form the thin fan of a fourth embodiment. Referring to FIGS. 9A and 9B, in this embodiment, the extended circuit 514 is distributed on the first surface A1 and the second surface A2. Herein, the first signal connecting structure 515 is disposed on the second surface A2. In more detailed, the extended circuit 514 extends from the first surface A1 to the second surface A2 and connects to the first signal connecting structure 515. When the thin fan of the fourth embodiment is applied to other electronic systems or electronic devices, it can also achieve the goal of space saving. FIG. 10 is a schematic diagram showing the housing of FIG. 9A applied to an electronic system. To make the figures more clear, a part of the extended circuit 514 on the first surface A1 of the housing 51 is omitted in FIG. 10, and the second surface A2 is shown by dotted lines. In more detailed, referring to FIG. 10, the electronic system E of this embodiment includes a thin fan (only shows the housing 51) and electronic devices 6. Wherein, a spring plate is disposed inside the electronic device 6 or on the casing thereof and is functioned as a second signal connecting structure 61. When housing 51 of the thin fan of the fourth embodiment is disposed opposite to the electronic device 6, the first signal connecting structure 515 is coupled to the second signal connecting structure 61. Accordingly, the electronic device 6 can output the power source/signals to the extended circuit 514 through the first signal connecting structure 515 and the second signal connecting structure 61. Then, the power source/signals can be further transmitted to the layout area 513 for controlling the operation of the thin fan.

This invention further discloses an electronic system including a thin fan and an electronic device. In this case, the components of the thin fan and the relationships thereof can be referred to the thin fans of the above-mentioned first to fourth embodiments, so the detailed descriptions thereof will be omitted. The electronic device has a second signal connecting structure for connecting to the first signal connecting structure of the thin fan.

As mentioned above, the manufacturing method of a thin fan of the invention is to process a plastic material containing a plurality of metal particles to form a housing, to remove a part surface of the housing and form a layout area on the housing, and to dispose a metal layer on the layout area. The step of removing the part surface of the housing is used to expose the metal particles, and the metal layer is disposed on the layout area so as to contact with the exposed metal particles, thereby electrically connecting the layout area to the first signal connecting structure. Compared with the conventional art, the thin fan of the invention removes the space for configuring the control circuit board in the conventional design. This configuration can decrease the entire height of the thin fan and effectively utilize the inside space. In addition, the extended circuit is extended to the periphery, outside or inside of the housing and connected to the first signal connecting structure. The configuration of the extended circuit can prevent the safety issue (e.g. the wire is hit by the blades), and save the space for configuring the connection with other electronic devices. Moreover, this invention can further provide the variability on the design of the extended circuit and the first signal connecting structure so as to benefit the design of the thin fan.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A thin fan, comprising: a housing composed of a plastic material containing a plurality of metal particles, the housing comprising: a layout area which is an integral part of the housing, wherein a first part of the metal particles is exposed to the layout area, an extended circuit which is an integral part of the housing, wherein a second part of the metal particles is exposed to the extended circuit, and a first terminal of the extended circuit connects to the layout area, a first signal connecting structure, wherein a terminal of the first signal connecting structure connects to a second terminal of the extended circuit, and a metal layer disposed on the layout area and the extended circuit and binding with the exposed metal particles; a stator disposed in the housing; and an impeller covered by the housing.

2. The thin fan of claim 1, wherein the housing further has a protrusion portion, and the first signal connecting structure is disposed on the protrusion portion.

3. The thin fan of claim 1, wherein the housing comprises a cable, and the cable is connected to the first signal connecting structure.

4. The thin fan of claim 1, wherein the housing further comprises a fixing unit, and the first signal connecting structure is disposed on the fixing unit.

5. The thin fan of claim 1, wherein the housing comprises a first surface and a second surface opposite to the first surface, the layout area is disposed on the first surface, the first signal connecting structure is disposed on the second surface, and the extended circuit is extended from the first surface to the second surface.

6. An electronic system, comprising: a thin fan comprising: a housing composed of a plastic material containing a plurality of metal particles, the housing comprising: a layout area which is an integral part of the housing, wherein a first part of the metal particles is exposed to the layout area, an extended circuit which is an integral part of the housing, wherein a second part of the metal particles is exposed to the extended circuit, and a first terminal of the extended circuit connects to the layout area, a first signal connecting structure, wherein a terminal of the first signal connecting structure connects to a second terminal of the extended circuit, and a metal layer disposed on the layout area and the extended circuit and binding with the exposed metal particles; a stator disposed in the housing; and an impeller covered by the housing; and an electronic device having a second signal connecting structure connecting with the first signal connecting structure.

7. The electronic system of claim 6, wherein the housing further has a protrusion portion, and the first signal connecting structure is disposed on the protrusion portion.

8. The electronic system of claim 6, wherein the housing comprises a cable, a first terminal of the cable is connected to the first signal connecting structure, and a second terminal of the cable is connected to the second signal connecting structure.

9. The electronic system of claim 6, wherein the housing further comprises a fixing unit, and the first signal connecting structure is disposed on the fixing unit.

10. The electronic system of claim 6, wherein the housing comprises a first surface and a second surface opposite to the first surface, the layout area is disposed on the first surface, the first signal connecting structure is disposed on the second surface, and the extended circuit is extended from the first surface to the second surface.

* * * * *